United States Patent
An et al.

(10) Patent No.: US 10,737,462 B2
(45) Date of Patent: Aug. 11, 2020

(54) METHOD FOR COATING SURFACE OF MOVING PART OF VEHICLE AND MOVING PART OF VEHICLE MANUFACTURED BY THE SAME

(71) Applicants: Hyundai Motor Company, Seoul (KR); Kia Motors Corporation, Seoul (KR); DONGWOO HST CO., LTD., Siheung-si (KR)

(72) Inventors: Jeong Uk An, Suwon-si (KR); Won Ki Chung, Seoul (KR); Jun Seok Lee, Incheon (KR)

(73) Assignees: Hyundai Motor Company, Seoul (KR); Kia Motors Corporation, Seoul (KR); DONGWOO HST CO., LTD., Siheung-si (KR)

( * ) Notice: Subject to any disclaimer, the term of this patent is extended or adjusted under 35 U.S.C. 154(b) by 160 days.

(21) Appl. No.: 15/653,224

(22) Filed: Jul. 18, 2017

(65) Prior Publication Data

US 2018/0056623 A1    Mar. 1, 2018

(30) Foreign Application Priority Data

Aug. 24, 2016  (KR) .................. 10-2016-0107411
May 10, 2017   (KR) .................. 10-2017-0058246

(51) Int. Cl.
  *F16C 33/02*  (2006.01)
  *F16C 33/08*  (2006.01)
  (Continued)

(52) U.S. Cl.
  CPC ............ *B32B 5/028* (2013.01); *B05D 1/36* (2013.01); *B05D 5/08* (2013.01); *B05D 7/51* (2013.01);
  (Continued)

(58) Field of Classification Search
  CPC .. F16C 33/101; F16C 33/1015; F16C 33/108; F16C 33/1085
  See application file for complete search history.

(56) References Cited

U.S. PATENT DOCUMENTS 4,658,500 A * 4/1987 Engel .................. F16C 33/14
                                                29/283.5
6,382,838 B1 * 5/2002 Yamada ............... F16C 9/00
                                                384/291
(Continued)

FOREIGN PATENT DOCUMENTS

JP      2005-170055 A     6/2005
KR      10-0772625 B1    11/2007
(Continued)

*Primary Examiner* — Adam Krupicka
(74) *Attorney, Agent, or Firm* — Morgan, Lewis & Bockius LLP

(57) ABSTRACT

A method for coating a surface of a moving part of a vehicle may include a coating preparation process of disposing a screen having a plurality of meshes to be distanced from a surface of the moving part of the vehicle to be coated depending on a predetermined spaced distance; and a coating layer deposition process of forming a coating layer having a pattern having a shape in which a plurality of embossings corresponding to the mesh shape is repeated on the surface of the moving part of the vehicle by a vacuum deposition scheme and forming the coating layer so that the adjacent emboss is connected to each other.

7 Claims, 9 Drawing Sheets

(51) Int. Cl.
*B32B 5/02* (2006.01)
*C23C 16/04* (2006.01)
*C10M 103/04* (2006.01)
*C23C 14/04* (2006.01)
*C10M 177/00* (2006.01)
*C23C 14/02* (2006.01)
*C10M 103/02* (2006.01)
*C10M 103/06* (2006.01)
*C09D 7/40* (2018.01)
*B05D 1/36* (2006.01)
*B05D 5/08* (2006.01)
*B05D 7/00* (2006.01)
*B41N 1/00* (2006.01)
*C10N 30/06* (2006.01)
*C10N 50/00* (2006.01)
*C10N 70/00* (2006.01)
*F16C 33/10* (2006.01)
*B05D 3/12* (2006.01)
*C09D 5/00* (2006.01)

(52) U.S. Cl.
CPC ............ *B41N 1/006* (2013.01); *C09D 7/70* (2018.01); *C10M 103/02* (2013.01); *C10M 103/04* (2013.01); *C10M 103/06* (2013.01); *C10M 177/00* (2013.01); *C23C 14/024* (2013.01); *C23C 14/042* (2013.01); *C23C 14/044* (2013.01); *C23C 16/042* (2013.01); *B05D 3/12* (2013.01); *C09D 5/00* (2013.01); *C10M 2201/0413* (2013.01); *C10M 2201/053* (2013.01); *C10M 2201/0603* (2013.01); *C10M 2201/0613* (2013.01); *C10N 2030/06* (2013.01); *C10N 2050/025* (2020.05); *C10N 2070/00* (2013.01); *F16C 33/101* (2013.01)

(56) References Cited

U.S. PATENT DOCUMENTS

| | | | | |
|---|---|---|---|---|
| 6,491,437 | B1* | 12/2002 | Yamada | F16C 33/14 384/284 |
| 6,565,258 | B1* | 5/2003 | Yamada | F16C 17/12 384/276 |
| 2001/0021353 | A1* | 9/2001 | Sakai | C22C 9/00 420/470 |
| 2005/0175837 | A1* | 8/2005 | Massler | C23C 14/58 428/408 |
| 2010/0319647 | A1* | 12/2010 | Ogawa | C22C 21/02 123/193.2 |
| 2013/0312681 | A1* | 11/2013 | Schultheis | F01L 13/0005 123/90.16 |
| 2015/0231703 | A1* | 8/2015 | Bjormander | B23B 27/146 428/162 |

FOREIGN PATENT DOCUMENTS

| | | |
|---|---|---|
| KR | 10-0794648 B1 | 1/2008 |
| KR | 10-2008-0038242 A | 5/2008 |
| KR | 10-2009-0013890 A | 2/2009 |
| KR | 10-2014-0016220 A | 2/2014 |
| KR | 10-2014-0028581 A | 3/2014 |
| KR | 10-2015-0118665 A | 10/2015 |
| KR | 10-2016-0070926 A | 6/2016 |

* cited by examiner

MOUNT / COAT SCREEN

FINAL PRODUCT

S : SPACED DISTANCE (μm)
A : THICKNESS OF PROTRUSION (μm)
B : THICKNESS OF CONNECTION PART (μm)

METHOD FOR COATING SURFACE OF MOVING PART OF VEHICLE AND MOVING PART OF VEHICLE MANUFACTURED BY THE SAME

CROSS REFERENCE TO RELATED APPLICATION

The present application claims priority to Korean Patent Application No. 10-2016-0107411, filed on Aug. 24, 2016, and Korean Patent Application No. 10-2017-0058246, filed on May 10, 2017, the entire contents of which is incorporated herein for all purposes by this reference.

BACKGROUND OF THE INVENTION

Field of the Invention

The present invention relates to a method for coating a surface of a moving part of a vehicle and a moving part of a vehicle formed with a coating layer, and more particularly, to a method for coating a surface of a moving part of a vehicle and a moving part of a vehicle manufactured by the same configured for improving friction characteristics by forming a coating layer having continued patterns on the surface of the moving part of the vehicle.

Description of Related Art

Generally, industrial products, in particular, most parts of a vehicle are parts that are manufactured and then are used for a long time, and thus noise, a fuel loss, or the like occurs when the products are worn or lubrication performance deteriorates, which leads to critical defects such as a leak problem of fuel and a reduction in efficiency.

Therefore, various research and developments for securing durability and low friction characteristics by applying low friction coating to surfaces of moving parts of a vehicle such as an engine, a camshaft, a tappet, and a bronzer have been conducted.

As low friction coating materials that are being put to practical use, there may be diamond like carbon (DLC) using vacuum equipment, tungsten carbide (WC), chrome nitride (CrN), or the like. The so formed coating layer has high hardness and excellent low friction characteristics and chemical resistance characteristics.

However, when a demand for a fuel efficiency problem that is considered to be important in a vehicle industry is increasing, there is a limitation of improving the friction characteristics only by the improvement in composition, thickness, or the like of the low friction coating layer, and therefore it is difficult to satisfy the friction characteristics required for the improvement in fuel efficiency.

Some researchers reported an example of improving additional low friction characteristics by a surface pattern or texturing technology. The technology gives shorted patterns having a circle, an oval, or the like to the low friction coating layer, and therefore a basic material and a discontinuous pattern are formed and a minute friction aggravation effect occurs around a pattern to which a heterogeneous material is exposed.

Therefore, the present invention proposes a method for coating a surface of a moving part having continued patterns without being shorted by controlling a thickness of low friction coating using a screen.

The information disclosed in this Background of the Invention section is only for enhancement of understanding of the general background of the invention and may not be taken as an acknowledgement or any form of suggestion that this information forms the prior art already known to a person skilled in the art.

BRIEF SUMMARY

Various aspects of the present invention are directed to providing a method for coating a surface of a moving part of a vehicle and a moving part of a vehicle manufactured by the same configured for improving friction characteristics by forming a coating layer having a plurality of continued patterns on the surface of the moving part of the vehicle.

According to an exemplary embodiment of the present invention, there is provided a method for coating a surface of a moving part of a vehicle, including: a coating preparation process of disposing a screen having a plurality of meshes to be distanced from a surface of the moving part of the vehicle to be coated depending on a predetermined spaced distance; and a coating layer deposition process of forming a coating layer having a pattern having a shape in which a plurality of embossings corresponding to the mesh shape is repeated on the surface of the moving part of the vehicle by a vacuum deposition scheme and forming the coating layer so that the adjacent emboss is connected to each other.

In the coating layer deposition process, the coating layer may be deposited by any one of physical vapor deposition (PVD) and chemical vapor deposition and the coating layer may be made of a material including at least one selected from metals, carbons, nitrides, and carbides.

The coating layer may have a multi-layer structure in which a plurality of coating layers having heterogeneous materials are stacked to improve low friction characteristics.

In the coating preparation process, the screen may be disposed to be distanced from the surface of the moving part of the vehicle by 0.5 to 200 μm.

The method may further include: prior to the coating layer deposition process, a buffer layer deposition process of depositing a buffer layer on the surface of the moving part of the vehicle to improve an adhesion of the coating layer.

In the buffer layer deposition process, the buffer layer made of a metal nitride material may be deposited by any one of physical vapor deposition (PVD) and chemical vapor deposition (CVD).

According to another exemplary embodiment of the present invention, there is provided a moving part of a vehicle, in which a surface of the moving part is formed with a coating layer including a plurality of protrusions protruding while being distanced from each other at an equal interval in vertical and horizontal directions thereof and a plurality of connection parts disposed between the adjacent protrusions to connect between the adjacent protrusions and formed to be lower than a height of the protrusion.

In the protrusion, the coating thickness rate determined by the following Equation (1) may range from 10 to 95%.

$$\text{Coating thickness rate (\%)} = B/A \times 100 \qquad (1)$$

In the above Equation, a may represent the thickness (μm) of the protrusion of the coating layer and B may represent a thickness (μm) of a connection part of the coating layer.

More preferably, the coating thickness ratio according to an exemplary embodiment of the present invention is 25 to 60%.

The protrusion may more protrude by 20 to 40% than a height of the connection part.

The coating layer may be made of a material including at least one selected from metals, carbons, nitrides, and carbides and may be deposited by any one of physical vapor deposition (PVD) and chemical vapor deposition (CVD).

The moving part of a vehicle may further include: a buffer layer configured to be disposed on a bottom surface of the coating layer to minimize a difference in lattice constant between the surface of the moving part of the vehicle and the coating layer.

The buffer layer may be formed at a thickness of 0.1 mm or less.

The buffer layer may include a plurality of buffer protrusions and buffer connection parts each formed at positions corresponding to the plurality of protrusions and connection parts, and the buffer connection part may connect between the adjacent buffer protrusions and is formed to be lower than a height of the buffer protrusion.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
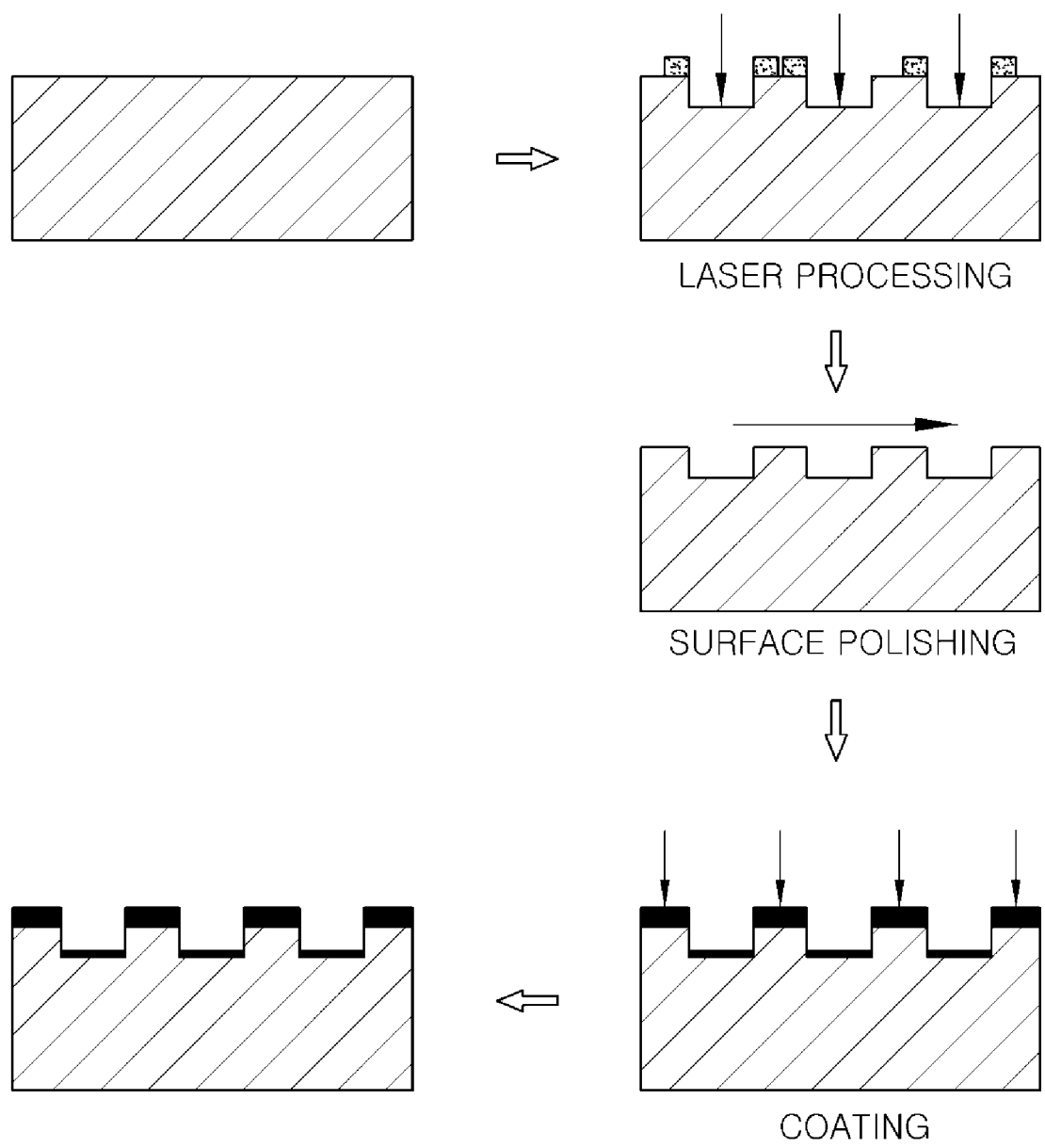
FIG. 1 is a diagram schematically illustrating a method for coating a surface having a general pattern according to the related art.

It may be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particularly intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the invention(s) will be described in conjunction with exemplary embodiments, it will be understood that the present description is not intended to limit the invention(s) to those exemplary embodiments. On the contrary, the invention(s) is/are intended to cover not only the exemplary embodiments, but also various alternatives, modifications, equivalents and other embodiments, which may be included within the spirit and scope of the invention as defined by the appended claims.

FIG. 1 is a diagram schematically illustrating a method for coating a surface having a general pattern according to the related art.

As illustrated in FIG. 1, in the case of forming a coating layer on a surface of a moving part of a vehicle by a vacuum deposition scheme, the coating layer is formed by a scheme of first ablating the surface of the moving part of the vehicle by a laser, polishing the surface, removing foreign materials including debris, and performing coating.

However, in the case of forming a pattern by ablating the surface of the moving part of the vehicle by the laser, or the like, the overall coating process is complicated and the finer the pattern, the longer the machining time, and therefore productivity is reduced, the formation of the pattern is non-uniform, or a bump occurs around some of the ablation portion to reduce low friction characteristics.

Therefore, the exemplary embodiment of the present invention forms the coating layer having a plurality of repetitive emboss shapes to form a uniform pattern without the occurrence of the bump by use of a screen having a plurality of fine meshes. Here, the coating layer in which adjacent emboss shapes is connected to each other is formed to improve the low friction characteristics.

Figure 2:
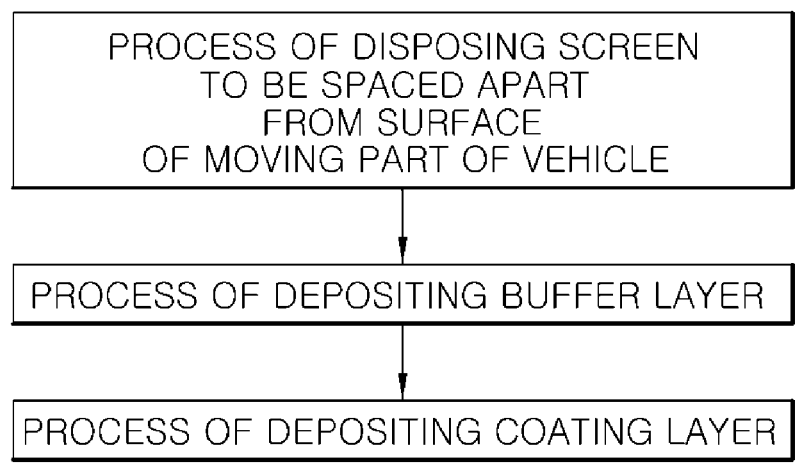
FIG. 2 is a flow chart illustrating a method for coating a surface of a moving part of a vehicle according to an exemplary embodiment of the present invention.
Figure 3:
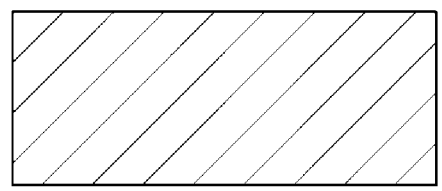
FIG. 3 is a diagram schematically illustrating the method for coating a surface of a moving part of a vehicle according to the exemplary embodiment of the present invention.
Figure 3:
Figure 3:
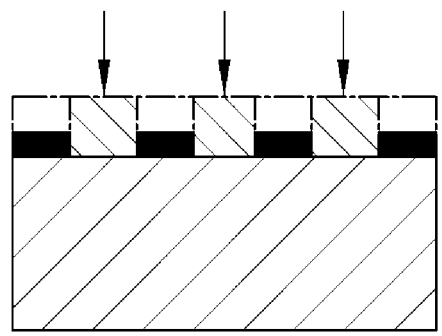
Figure 3:
Figure 3:
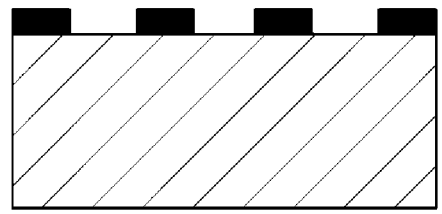

FIG. 2 is a flow chart illustrating a method for coating a surface of a moving part of a vehicle according to an exemplary embodiment of the present invention and FIG. 3 is a diagram schematically illustrating the method for coating a surface of a moving part of a vehicle according to the exemplary embodiment of the present invention.

As illustrated in FIG. 2 and FIG. 3, the method for coating a surface of a moving part of a vehicle according to the exemplary embodiment of the present invention includes a process of manufacturing the screen, a coating preparation process of disposing the screen to be distanced from the surface of the moving part of the vehicle, and a coating layer deposition process of forming the coating layer on the surface of the moving part of the vehicle.

Figure 4:
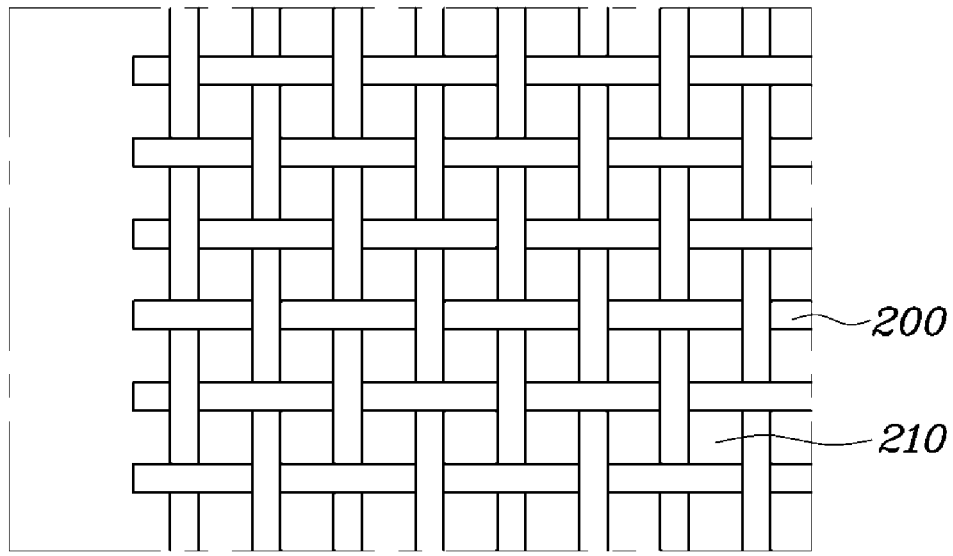
FIG. 4 is a photograph illustrating a screen having a plurality of meshes used in an exemplary embodiment of the present invention.

FIG. 4 is a photograph illustrating a screen having a plurality of meshes used in an exemplary embodiment of the present invention.

As illustrated in FIG. 4, a screen 200 according to an exemplary embodiment of the present invention may be provided to have a shape corresponding to a pattern of a coating layer on which a plurality of meshes 210 are formed.

That is, the screen 200 used in the exemplary embodiment of the present invention is repeatedly formed with the plurality of meshes corresponding to each emboss of the coating layer forming a predetermined pattern by repeatedly disposing the plurality of embosses.

At this time, a shape of the mesh 210 may have various shapes including a quadrangle, a circle, and a diamond but the plurality of meshes 210 may preferably have the same shape.

The reason is that the uniform friction characteristics may be formed over the whole surface of the moving part 100 of the vehicle that needs to be formed in the same shape and similar abrasion may be formed over the whole surface of a deposited coating layer 300, improving a lifespan of products.

The screen 200 used in the exemplary embodiment of the present invention may include a metal material having excellent conductivity.

The reason is that the coating layer may be smoothly deposited when the coating layer is formed by the vacuum deposition scheme.

As described above, when the screen 200 on which the plurality of meshes 210 having the same shape are repeatedly formed is prepared, the screen 200 is distanced from the surface of the moving part 100 of the vehicle depending on the predetermined spaced distance in the coating preparation process.

Figure 5:
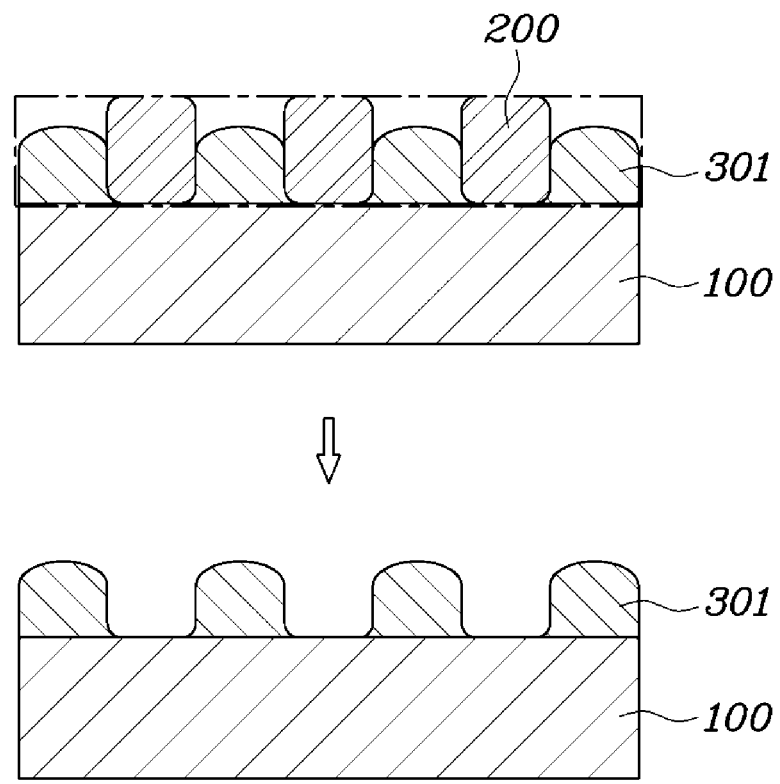
FIG. 5 and FIG. 6 are diagrams for explaining a formation of a coating layer depending on a spaced distance between the screen and the surface of the moving part of the vehicle.
Figure 6:
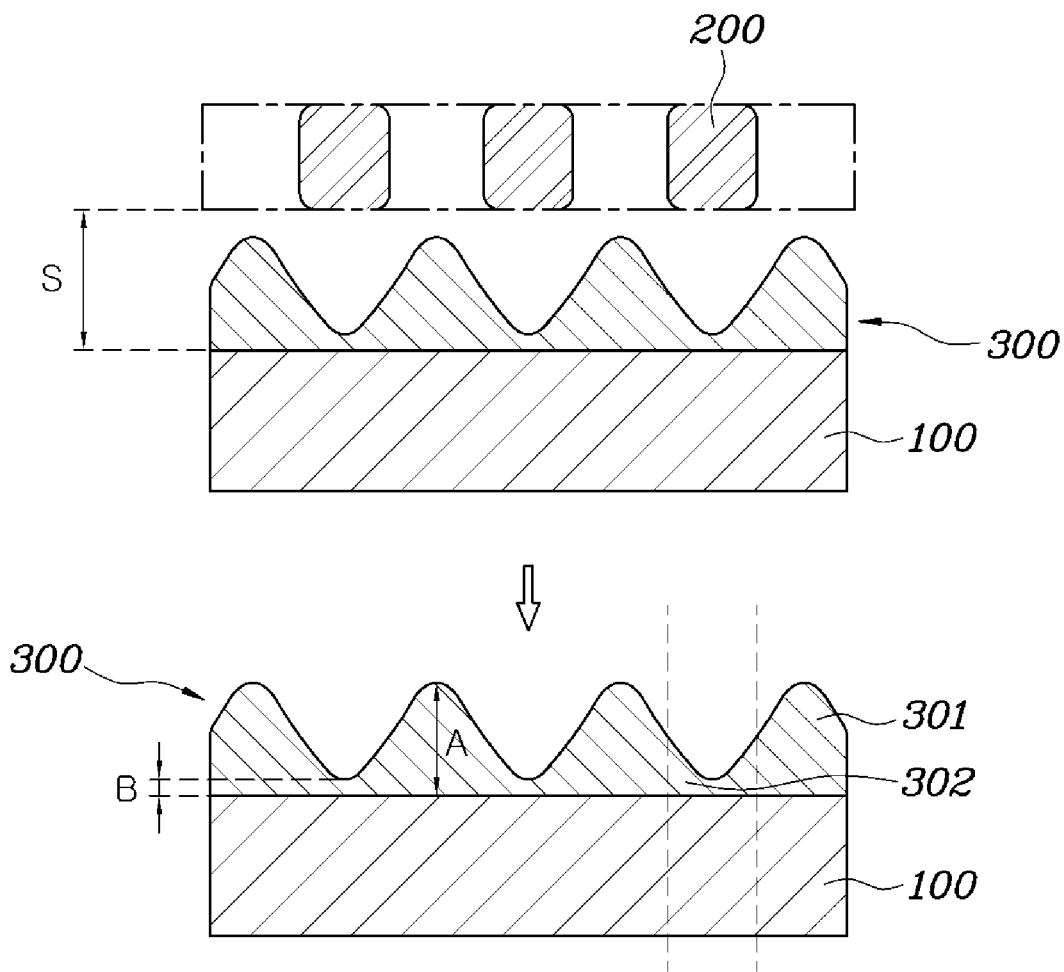
Figure 7:
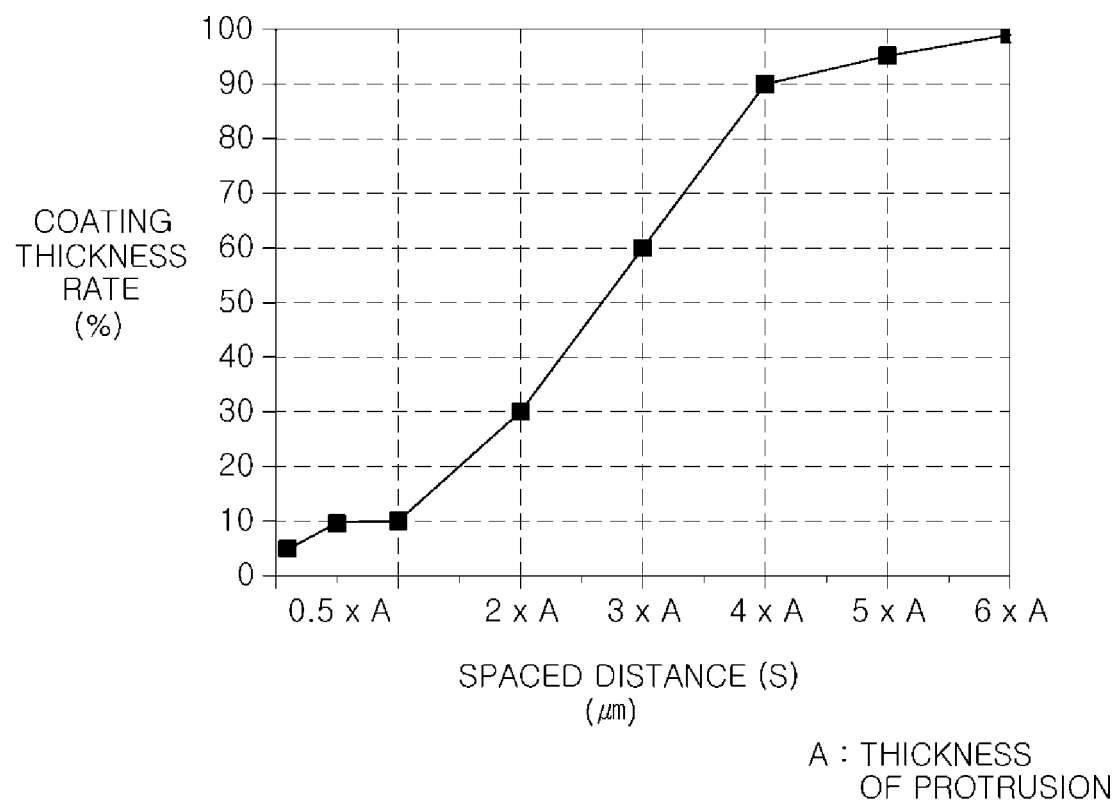
FIG. 7 is a graph showing a coating thickness rate of a coating layer depending on a spaced distance S.
Figure 8:
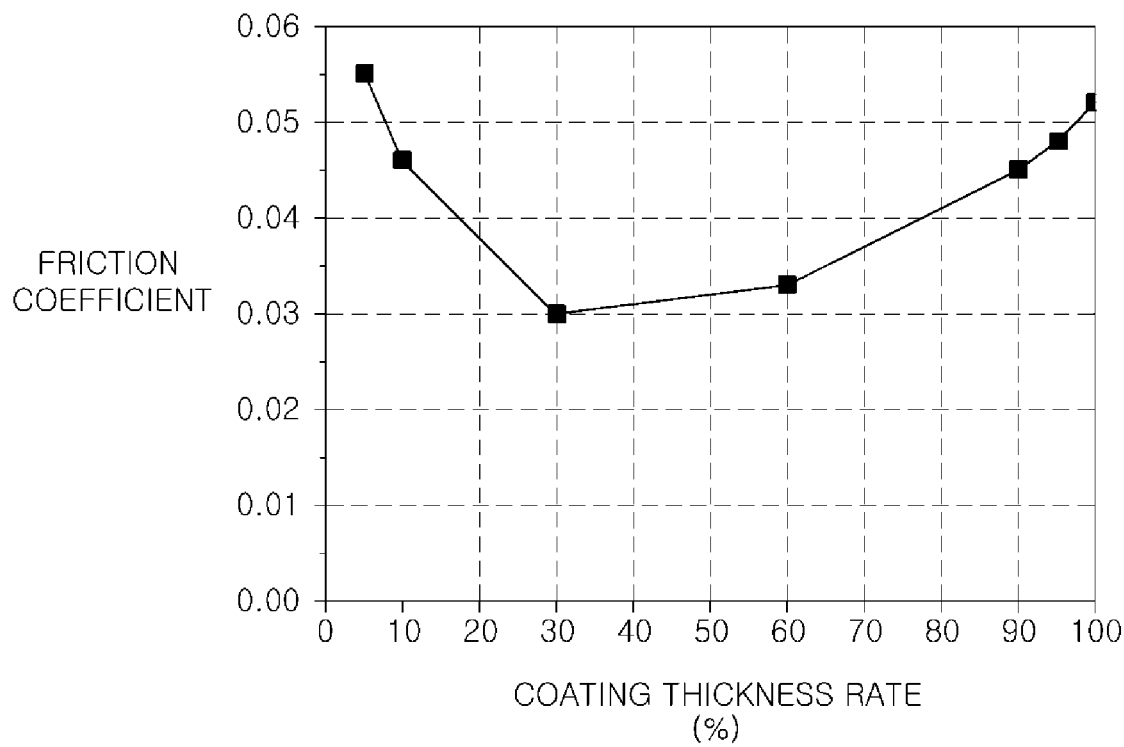
FIG. 8 is a graph illustrating a relationship between the coating thickness rate of the coating layer and a friction coefficient.

FIG. 5 and FIG. 6 are diagrams for explaining a formation of a coating layer depending on a spaced distance between the screen and the surface of the moving part of the vehicle, FIG. 7 is a graph showing a coating thickness rate of a coating layer depending on a spaced distance, and FIG. 8 is a graph illustrating a relationship between the coating thickness rate of the coating layer and a friction coefficient.

As illustrated in FIGS. 5 to 8, a spaced distance S according to an exemplary embodiment of the present invention is preferably 0.5 to 5 times a thickness of a protrusion 301 of the coating layer 300.

The reason is that to secure a low friction characteristic of a friction coefficient of 0.05 or less, the coating layer 300 having a predetermined pattern needs to be formed while the coating thickness rate determined by the following Equation (1) satisfies 10 to 95%.

$$\text{Coating thickness rate (\%)} = B/A \times 100 \quad (1)$$

At this point, A represents the thickness of the protrusion 301 of the coating layer 300 and B represents a thickness of a connection part 302.

In other words, the thickness of the protrusion 301 means a thickness of the thickest portion of the coating layer, and the thickness of the connecting part 302 means a thickness of the thinnest part of the coating layer.

More specifically, the coating thickness rate according to the above Equation (1) gradually increases as the spaced distance S increases, and when the spaced distance S exceeds 5 times the thickness of the protrusion 301, the connection part 302 and the protrusion 301 are formed at almost the same height, such that a pattern forming effect is insignificant and when the spaced distance S is 0.5 times less than the thickness of the protrusion 301, the connection part 302 is not formed and thus the adjacent protrusions 301 are not connected to each other and the short-circuited coating layer 300 is formed, such that the friction characteristics may deteriorate.

Accordingly, to form the coating layer 300 formed with a predetermined pattern at a coating thickness rate of 10 to 95%, it is preferable to space the screen 200 so that the spaced distance S is 0.5 to 5 times the thickness of the protrusion 301 on the coating layer 300.

More preferably, the coating thickness ratio according to an exemplary embodiment of the present invention is 25 to 60%. The reason is that to secure a low friction characteristic of a friction coefficient of 0.035 or less.

That is, to form the coating layer 300 having a predetermined pattern and formed with the protrusion 301 having a thickness of 0.5 to 40 μm on the surface of the moving part 100 of the vehicle, the surface of the moving part 100 of the vehicle and the screen 200 are disposed to be distanced from each other by 0.5 to 200 μm so that the spaced distance S between the surface of the moving part 100 of the vehicle and the screen 200 is 0.5 to 5 times the thickness of the protrusion 301 of the coating layer 300 to be deposited.

When the coating preparation is completed, the coating layer 300 having a pattern is deposited on the surface of the moving part 100 of the vehicle by the vacuum deposition scheme during the coating layer deposition process, and the coating layer is deposited by any a of physical vapor deposition (PVD) including sputtering, arc ion plate, or the like and chemical vapor deposition (CVD).

In the instant case, the coating layer 300 may be deposited with all materials including metals, diamond-like carbon (DLC) including silicon (Si), tungsten (W)/chrome (Cr)/titanium (Ti) or pure DLC, carbons including Ta—C, nitrides including chrome (Cr)/molybdenum (Mo)/zirconium (Zr)/aluminum (Al) nitrides, carbides, or the like that may improve the low friction characteristics.

As described above, the friction characteristics the coating layer 300 formed to have a predetermined pattern according to the exemplary embodiment of the present invention may improve by about 25 to 50%, compared to that of the existing coating layer on which the pattern is not formed.

The coating layer 300 according to the exemplary embodiment of the present invention may have a multi-layer structure in which a plurality of coating layers having heterogeneous materials are stacked, improving the low friction characteristics.

For example, the coating layer 300 may be formed in a multi-layer coating layer in which a first coating layer includes a metal-based material, a second coating layer includes a nitride-based material, and a third coating layer includes a carbon-based material.

Therefore, the coating layer 300 is formed by stacking the first to third coating layers made of different materials to have different friction characteristics to exhibit different friction characteristics for each layer, improving the friction characteristics of the entire coating layer 300.

Further, since noise vibration absorbing ranges in which noise and vibrations may be absorbed are different depending on a material, a material between the respective layers is formed differently to expand the noise vibration absorbing ranges, simultaneously improving noise, vibration, and harshness (NVH) of the coating layer 300.

Figure 9:
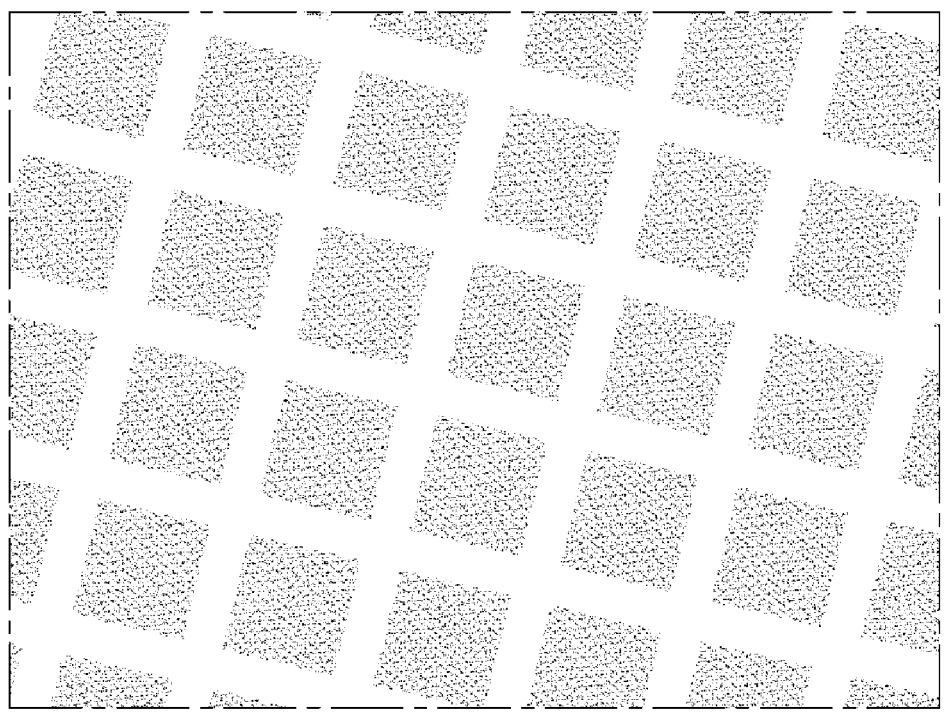
FIG. 9 is an SEM photograph of the coating layer manufactured according to the exemplary embodiment of the present invention.
Figure 10:
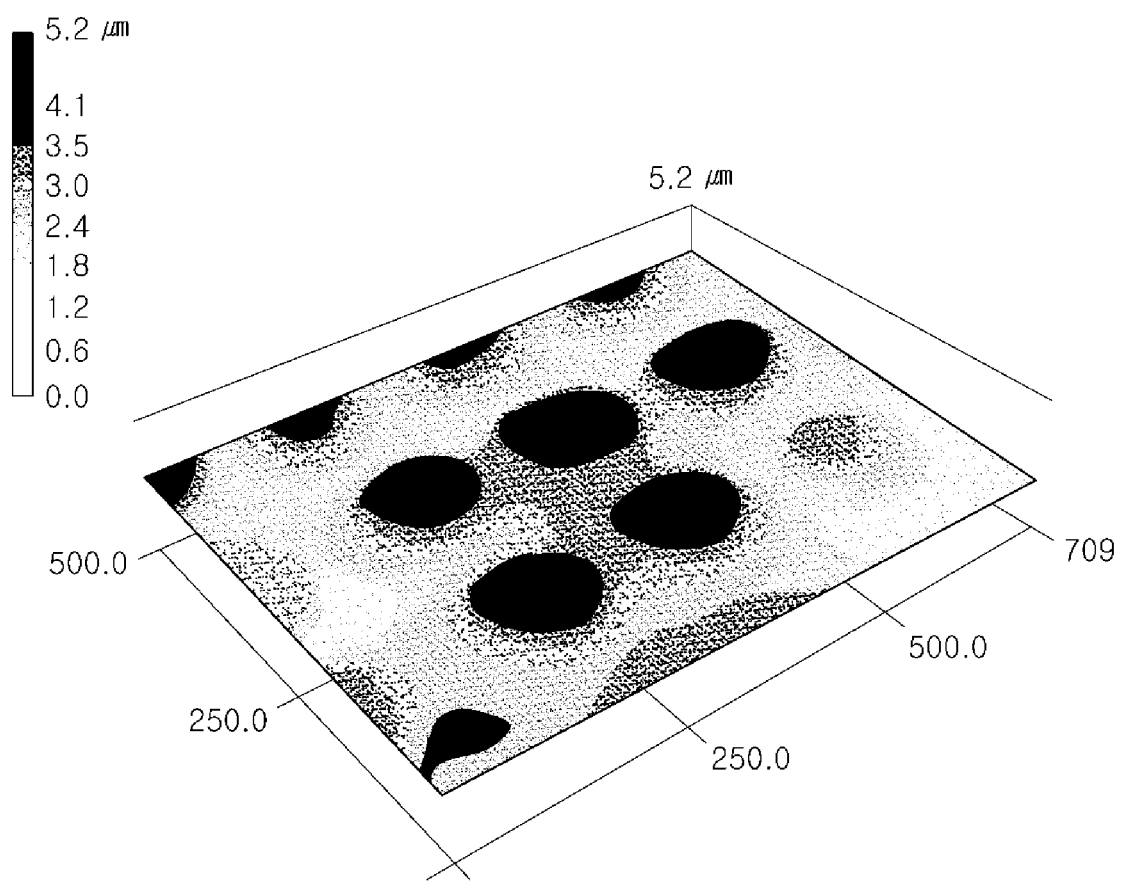
FIG. 10 is a diagram illustrating a shape of the surface of the coating layer according to the exemplary embodiment of the present invention.
Figure 11:
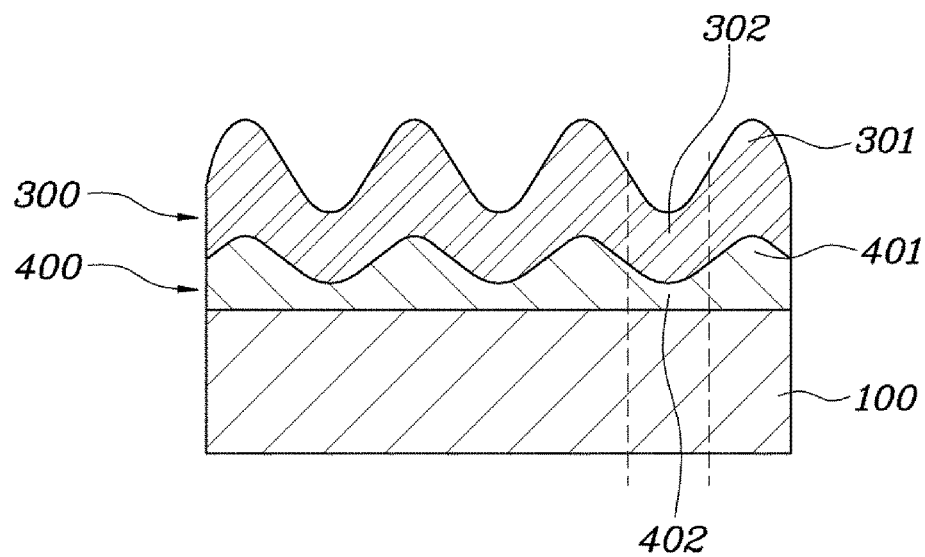
FIG. 11 is a diagram illustrating a cross section of the coating layer manufactured according to the exemplary embodiment of the present invention.

FIG. 9 is an SEM photograph of the coating layer manufactured according to the exemplary embodiment of the present invention, FIG. 10 is a diagram illustrating a shape of the surface of the coating layer according to the exemplary embodiment of the present invention, and FIG. 11 is a diagram illustrating a cross section of the coating layer manufactured according to the exemplary embodiment of the present invention.

As illustrated in FIGS. 9 and 11, it can be appreciated that the coating layer manufactured according to the exemplary embodiment of the present invention may be formed with a uniform pattern in which the plurality of embossings having the same shape, that is, the protrusions 301 are spaced from each other in vertical and horizontal directions thereof.

At this time, the method for coating a surface of a moving part of a vehicle according to the exemplary embodiment of the present invention may further include a process of depositing a buffer layer 400 to improve an adhesion between the moving part 100 of the vehicle and the coating layer 300.

The process of depositing a buffer layer 400 may include a material similar to the coating layer 300 or the moving part 100 of the vehicle and may be formed by the same method as the coating layer 300.

Therefore, a difference in lattice constant between the moving part 100 of the vehicle and the coating layer 300 may be minimized to improve the adhesion of the deposited coating layer 300.

In the instant case, the thickness of the buffer layer 400 may be preferably formed at 0.1 mm or less. The reason is that when the thickness of the buffer layer 400 exceeds 0.1 mm, the buffer layer 400 is excessively thick and therefore the manufacturing costs may be increased.

In an exemplary embodiment of the present invention, the buffer layer 400 may include a plurality of buffer protrusions 401 and buffer connection parts 402 each formed at positions corresponding to the plurality of protrusions 301 and connection parts 302, and the buffer connection parts 402 connect between adjacent buffer protrusions 401 and is formed to be lower than a height of the buffer protrusions 401.

Figure 12:
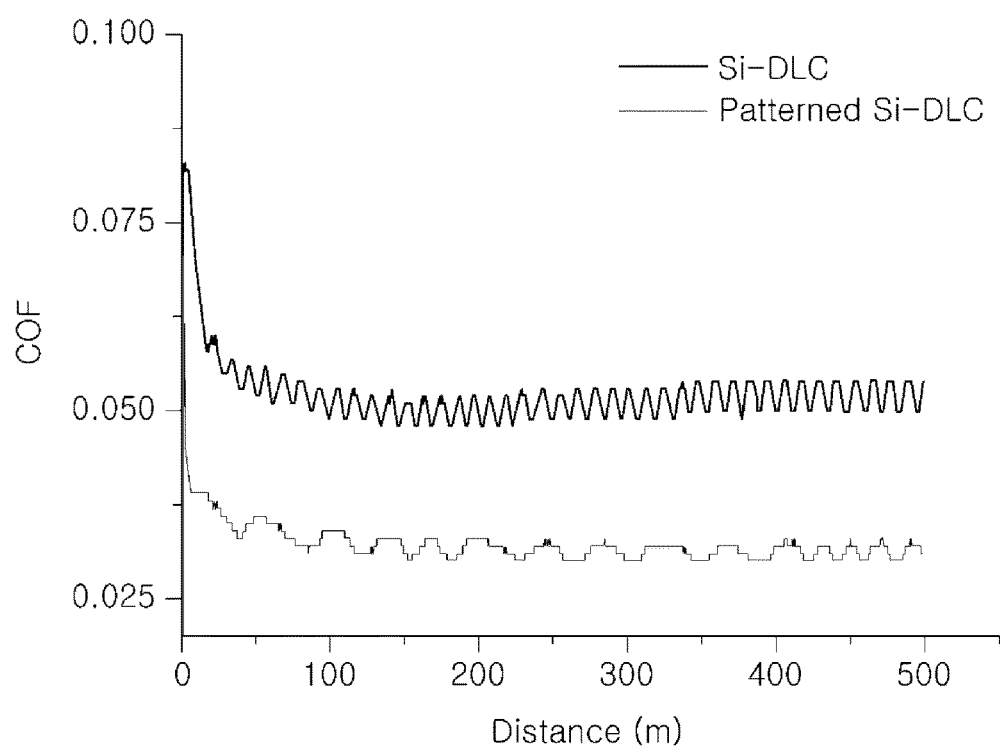
FIG. 12 is a graph illustrating measurement results of the friction coefficients of the coating layer according to the exemplary embodiment of the present invention and a general non-pattern coating layer according to the related art.

FIG. 12 is a graph illustrating measurement results of the friction coefficients of the coating layer according to the exemplary embodiment of the present invention and a general non-pattern coating layer according to the related art depending on a travelling distance.

At this time, the example is an Si-DLC coating layer having a pattern in which a quadrangular emboss of 200 μm×200 μm is repeated in the vertical and horizontal directions thereof and the comparative example is the Si-DLC coating layer on which the pattern is not formed, in which a friction coefficient (COF) depending on the travelling distance (m) was measured by rotating the example and the comparative example at a load of 10N and a linear speed of 500 mm/s under a normal temperature oil condition to measure.

As illustrated in FIG. 12, the comparative example, that is, the friction coefficient of the existing non-pattern Si-DLC coating layer on which the pattern is not formed is 0.050, while the friction coefficient of the example formed according to the exemplary embodiment of the present invention is about 0.030, such that it can be appreciated that the friction characteristics are increased by about 40%, compared to the comparative example.

According to the exemplary embodiments of the present invention, it is possible to improve the friction characteristics of the moving part of the vehicle by forming the coating layer having the predetermined pattern on the surface of the moving part of the vehicle.

Further, it is possible to improve the productivity by reducing the manufacturing time and the coating costs of the coating layer having the pattern.

For convenience in explanation and accurate definition in the appended claims, the terms "upper", "lower", "internal", "outer", "up", "down", "upper", "lower", "upwards", "downwards", "front", "rear", "back", "inside", "outside", "inwardly", "outwardly", "internal", "external", "internal", "outer", "forwards", and "backwards" are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described to explain certain principles of the invention and their practical application, to enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A driving part of a vehicle, wherein a surface of the driving part is formed with a coating layer including a plurality of protrusions,
   wherein each of the plurality of protrusions is in a same shape and distanced from each other at an equal interval in vertical and horizontal directions to form a uniform pattern on the surface of the driving,
   wherein a plurality of connection parts are disposed between the plurality of protrusions being adjacent,
   wherein the plurality of connection parts is formed to be lower than a height of the protrusions,
   wherein the coating layer has a multi-layer structure formed by stacking a first coating layer, a second coating layer, and a third coating layer, each of which is made of a material different from each other, and
   wherein the first coating layer includes a metal-based material, the second coating layer includes a nitride-based material, and the third coating layer includes a carbon-based material.

2. The driving part of the vehicle of claim 1, wherein in the protrusions, a coating thickness rate determined by the following Equation (1) ranges from 10 to 95%:

$$\text{Coating thickness rate (\%)} = B/A \times 100 \qquad (1)$$

Wherein A represents a thickness (μm) of the protrusions of the coating layer and B represents a thickness (μm) of connection parts of the coating layer.

3. The driving part of the vehicle of claim 2, wherein in the coating thickness rate ranges from 25 to 60%.

4. The driving part of the vehicle of claim 1, wherein the coating layer is made of a material including at least one selected from metals, carbons, nitrides, and carbides and is deposited by any one of physical vapor deposition (PVD) and chemical vapor deposition (CVD).

5. The driving part of the vehicle of claim 1, further comprising:
   a buffer layer configured to be disposed on a bottom surface of the coating layer.

6. The driving part of the vehicle of claim 5, wherein the buffer layer is formed at a thickness of 0.1 mm or less.

7. The driving part of the vehicle of claim 5, wherein the buffer layer includes a plurality of buffer protrusions and buffer connection parts each formed at positions corresponding to the plurality of protrusions and connection parts, and
   wherein the buffer connection parts connect between adjacent buffer protrusions and is formed to be lower than a height of the buffer protrusions.

* * * * *